US007890906B2

United States Patent
Chadwick et al.

(10) Patent No.: US 7,890,906 B2
(45) Date of Patent: Feb. 15, 2011

(54) METHOD OF LAYING OUT INTEGRATED CIRCUIT DESIGN BASED ON KNOWN POLYSILICON PERIMETER DENSITIES OF INDIVIDUAL CELLS

(75) Inventors: Laura S. Chadwick, Essex Junction, VT (US); James A. Culp, Downingtown, PA (US); David J. Hathaway, Underhill, VT (US); Anthony D. Polson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 259 days.

(21) Appl. No.: 12/117,761

(22) Filed: May 9, 2008

(65) Prior Publication Data

US 2009/0282380 A1 Nov. 12, 2009

(51) Int. Cl.
*G06F 17/50* (2006.01)
(52) U.S. Cl. .............................................. 716/9; 716/1
(58) Field of Classification Search ...................... 716/1, 716/2, 9
See application file for complete search history.

(56) References Cited

U.S. PATENT DOCUMENTS

| | | | | |
|---|---|---|---|---|
| 5,847,969 | A * | 12/1998 | Miller et al. | 716/17 |
| 6,323,113 | B1 * | 11/2001 | Gabriel et al. | 438/584 |
| 6,415,425 | B1 * | 7/2002 | Chaudhary et al. | 716/9 |
| 6,807,656 | B1 | 10/2004 | Cao et al. | |
| 6,938,226 | B2 | 8/2005 | Nguyen et al. | |
| 7,089,520 | B2 | 8/2006 | Voldman | |
| 7,095,063 | B2 | 8/2006 | Cohn et al. | |
| 7,662,522 | B2 * | 2/2010 | Abe | 430/5 |
| 2005/0076320 | A1 * | 4/2005 | Maeda | 716/10 |
| 2007/0118320 | A1 | 5/2007 | Luo et al. | |
| 2007/0245284 | A1 * | 10/2007 | Sinha et al. | 716/10 |
| 2008/0176343 | A1 * | 7/2008 | Chang et al. | 438/5 |
| 2008/0206654 | A1 * | 8/2008 | Abe | 430/5 |
| 2009/0064074 | A1 * | 3/2009 | Alpert et al. | 716/8 |
| 2009/0181551 | A1 * | 7/2009 | Tan et al. | 438/795 |

(Continued)

OTHER PUBLICATIONS

Kahng, et al., "Filling Algorithms and Analyses for Layout Density Control," IEEE Transactions on Computer-Aided Design of Integrated Circuits and Systems, vol. 18, No. 4, Apr. 1999, pp. 445-462.

(Continued)

*Primary Examiner*—Jack Chiang
*Assistant Examiner*—Suchin Parihar
(74) *Attorney, Agent, or Firm*—Gibb I.P. Law Firm, LLC; Richard M. Kotulak, Esq.

(57) ABSTRACT

Disclosed is a method of laying out individual cells of an integrated circuit design, based at least in part on the known polysilicon perimeter densities of those cells. That is, the method embodiments use the knowledge of polysilicon perimeter density for known cells to drive placement of those cells on a chip (i.e., to drive floor-planning). The method embodiments can be used to achieve approximately uniform across-chip polysilicon perimeter density and, thereby to limit performance parameter variations between functional devices that are attributable to variations in polysilicon perimeter density. Alternatively, the method embodiments can be used to selectively control variations in the average polysilicon perimeter density of different regions of a chip and, thereby to selectively control certain performance parameter variations between functional devices located in those different regions.

16 Claims, 11 Drawing Sheets

U.S. PATENT DOCUMENTS

2009/0278222 A1* 11/2009 Chadwick et al. ........... 257/499
2009/0319973 A1* 12/2009 Anderson et al. .............. 716/9
2010/0077367 A1* 3/2010 Nitta ............................. 716/5

OTHER PUBLICATIONS

Kahng, A., "IC Layout and Manufacturability: Critical Links and Design Flow Implications," UCLA Department of Computer Science, pp. 1-6.

* cited by examiner

METHOD OF LAYING OUT INTEGRATED CIRCUIT DESIGN BASED ON KNOWN POLYSILICON PERIMETER DENSITIES OF INDIVIDUAL CELLS

CROSS-REFERENCE TO RELATED APPLICATIONS

This application is related to the following applications filed concurrently herewith by the same Applicants and assigned to the same Assignee, namely, International Business Machines Corporation (IBM Corporation): "INTEGRATED CIRCUIT WITH UNIFORM POLYSILICON PERIMETER DENSITY, METHOD AND DESIGN STRUCTURE" Ser. No. 12/117,855 and "INTEGRATED CIRCUIT WITH UNIFORM POLYSILICON PERIMETER DENSITY, METHOD) AND DESIGN STRUCTURE" Ser. No. 12/117,771. The complete disclosures of these co-pending applications are incorporated herein by reference.

BACKGROUND OF THE INVENTION

1. Field of the Invention

The embodiments of the invention generally relate to the impacts of across-chip polysilicon perimeter density variations on device performance parameters and, more particularly, to method of laying out an integrated circuit design based at least in part on known polysilicon perimeter densities of individual cells in order to achieve approximately uniform across-chip polysilicon perimeter density or to selectively control across-chip polysilicon perimeter density variations.

2. Description of the Related Art

With continued scaling of integrated circuit devices, product developers have noticed variations in performance parameters of devices located within different regions on the same chip. Thus, there is a need in the art for a method of forming integrated circuits that allows for continued device scaling, while minimizing or selectively controlling across-chip performance parameter variations.

BRIEF SUMMARY OF THE INVENTION

In view of the foregoing, disclosed herein are embodiments of a method of laying out individual cells of an integrated circuit design, based at least in part on the known polysilicon perimeter densities of those cells. That is, the method embodiments use the knowledge of polysilicon perimeter density for known cells to drive placement of those cells on a chip (i.e., to drive floor-planning). The method embodiments can be used to achieve approximately uniform across-chip polysilicon perimeter density and, thereby to limit performance parameter variations between functional devices that are attributable to variations in polysilicon perimeter density. Alternatively, the method embodiments can be used to selectively control variations in the average polysilicon perimeter density of different regions of a chip and, thereby to selectively control certain performance parameter variations between functional devices located in those different regions.

Generally, the embodiments of the method comprise providing a library of predefined cells with known polysilicon perimeter densities. Specifically, predefined cells are selected for incorporation into such a library. Then, for each predefined cell, the polysilicon perimeter density is determined by dividing a sum of the perimeter of all polysilicon shapes in the predefined cell by the area of the cell.

Then, a design for the integrated circuit is received. After the design is received, those cells required to form the integrated circuit according to the design are selected from the library and, more particularly, those cells containing the functional devices required to form the integrated circuit according to the design are selected from the library. Then, the locations on a chip for the cells are determined (i.e., laid out) based at least in part on the known polysilicon perimeter densities of the different cells in order to either achieve approximately uniform across-chip polysilicon perimeter density or to selectively control across-chip polysilicon perimeter density variations.

For example, the process of determining the on-chip locations for the cells in order to achieve approximately uniform across-chip polysilicon perimeter density can comprise distributing cells that have relatively high polysilicon perimeter densities approximately evenly across the chip and, similarly, distributing cells that have relatively low polysilicon perimeter densities approximately evenly across the chip. As a result of such approximately uniform polysilicon perimeter density, performance parameter variations between functional devices in different regions on the chip and, more particularly, performance parameter variations that are attributable to polysilicon perimeter density variations (e.g., threshold voltage variations between functional devices in different regions of a chip) are limited.

In another example, the process of determining the on-chip locations for the cells in order to selectively control across-chip polysilicon perimeter density variations comprises distributing cells having relatively high polysilicon perimeter densities within a first region of the chip; and distributing cells having a relatively low polysilicon perimeter density within a second region of the chip that is different from the first region. By selectively controlling across-chip polysilicon perimeter density, designers can take advantage of known performance parameter variations (e.g., threshold voltage variations) that are attributable to polysilicon perimeter density variations between the first region and the second region. Thus, for example, cells with functional devices requiring faster switching speeds can be placed in one region with a relatively high polysilicon perimeter density and cells with functional devices requiring slower switching speeds can be placed in a different region with a relatively low polysilicon perimeter density.

It should be noted that in addition to containing predefined functional device cells required for integrated circuit designs, the provided library can also contain additional cells, such as decoupling capacitor cells, gate array cells, white space fill cells, etc. Thus, the method embodiments can also comprise selecting, from the library, at least one additional cell comprising, for example, at least one decoupling capacitor required to achieve a predetermined decoupling capacitance value, at least one gate array to allow additional logic to subsequently be added to the design and/or at least one white space fill cell to ensure process uniformity. Then, during the process of determining the on-chip locations for the functional device cells, the on-chip locations for the additional cell(s) can similarly be determined, based at least in part on their known polysilicon perimeter densities.

In a more specific embodiment of the method used to achieve approximately uniform across-chip polysilicon perimeter density, a library of predefined cells is similarly provided. However, in this particular embodiment the provided library contains sets of predefined cells, where each set comprises multiple predefined cells all having the same function but different configurations and, thereby different polysilicon perimeter densities. Then, for each predefined cell in each set, the polysilicon perimeter density is determined by dividing a sum of the perimeter of all polysilicon shapes in the predefined cell by the area of the cell. Then, a design for an integrated circuit is received. After the design is received, a mapping order for those cells required to form the integrated circuit according to the design is determined and, more particularly, a mapping order for those cells containing the functional devices required to form the integrated circuit according to the design is determined. This mapping order is based on some predetermined criteria (e.g., based on how critical the cell is to the design).

Next, according to the mapping order, the cells are mapped out on the chip such that polysilicon perimeter density across the chip is approximately uniform. Specifically, this mapping process comprises, for the first cell as designated by the previously determined mapping order, determining a current average polysilicon perimeter density on the chip. This current average polysilicon perimeter density of the chip is compared to a target average polysilicon perimeter density. Then, for that first cell, a predefined cell is selected from amongst the predefined cells in one of the sets of predefined cells in the library, based at least in part on the known polysilicon perimeter density of that predefined cell in order to adjust the current average polysilicon perimeter density towards the target average perimeter density. Thus, for example, if the current average polysilicon perimeter density is above the target average polysilicon perimeter density, then a predefined cell having a polysilicon perimeter density that is lower than the target average polysilicon perimeter density is selected for the first cell. Contrarily, if the current average polysilicon perimeter density is below the target average polysilicon perimeter density, then a predefined cell having a polysilicon perimeter density that is higher than the target average polysilicon perimeter density is selected for the first cell. This mapping process is repeated for the second cell in the mapping order, the third cell and so on, until all of the cells required for the design are mapped onto the chip. As mentioned above, due to the approximately uniform polysilicon perimeter density, performance parameter variations between functional devices in different regions on the chip and, more particularly, performance parameter variations that are attributable to polysilicon perimeter density variations (e.g., threshold voltage variations between functional devices in different regions of a chip) are limited.

It should be noted that in addition to containing sets of predefined functional device cells required for integrated circuit designs, the library can also contain sets of predefined decoupling capacitor cells, gate arrays cells, white space fill cells, etc. Thus, the method embodiments can also comprise determining the mapping order for decoupling capacitor cells required to achieve a predetermined decoupling capacitance value, for gate array cells that will allow additional logic to subsequently be added to the design, and/or for white space fill cells to ensure process uniformity. This mapping order can be determined either separately from or in conjunction with the mapping order for the functional device cells. Once the mapping order is determined, the decoupling capacitor cells, the gate array cells, white space fill cells, etc. can be mapped in the same manner, as described above, used for the functional device cells.

In another more specific embodiment of the method used for selectively controlling across-chip polysilicon perimeter density, a library of predefined cells with known polysilicon perimeter densities is similarly provided. That is, predefined cells are selected for incorporation into such a library. Then, for each predefined cell, the polysilicon perimeter density is determined by dividing a sum of the perimeter of all polysilicon shapes in the predefined cell by the area of the cell.

Then, a design for the integrated circuit is received. After the design is received, multiple predefined cells that contain the functional devices, which are required to form the integrated circuit according to the design, are selected from the library. These multiple predefined cells are then sorted based on relative importance of a specified performance parameter and, specifically, on the relative importance of a specific performance parameter that is impacted by variations in polysilicon perimeter density across a chip.

Once the cells are sorted based on the relative importance of the specified performance parameter, the locations on the chip for the multiple predefined cells is determined based at least in part on the relative importance of the specified performance parameter. That is, predefined cells for which the specific performance parameter is of high importance are located in a first region of the chip having a first average polysilicon perimeter density, whereas predefined cells for which the specific performance parameter is of low importance are located in a second region of the chip having an second average polysilicon perimeter density that is different from the first average polysilicon perimeter density. This process takes advantage of the variations in polysilicon perimeter density and, more particularly, selectively controls across-chip polysilicon perimeter density so that functional devices in the first region will perform differently than functional devices in the second region.

For example, the specified performance parameter can be switching speed because switching speed depends on threshold voltage. Threshold voltage varies between different devices depending upon the local polysilicon perimeter density. In regions with higher polysilicon perimeter density, spacer widths are thinner. Thus, threshold voltages are lower and switching speeds are faster. In regions with lower polysilicon perimeter density, spacer widths are thicker. Thus, threshold voltages are higher and switching speeds are slower.

In this ease, the importance of switching speed to the functional devices in each cell can be determined, then the process of determining the locations on the chip for each of the predefined cells can comprise placing the predefined cells requiring relatively fast switching speeds in the first region, where the first average polysilicon perimeter density is a relatively high polysilicon perimeter density. This process can further comprise placing the predefined cells requiring relatively slow switching in the second region, where the second average polysilicon perimeter density is a relatively low polysilicon perimeter density. Thus, the process selectively controls the polysilicon perimeter density in the first and second regions of the chip so that the functional devices in these regions have different optimal switching speeds.

It should be noted that in addition to containing predefined functional device cells required for integrated circuit designs, the provided library can contain decoupling capacitor cells, gate array cells, white space fill cells, etc. Thus, the method embodiments can also comprise selecting, from the library, at least one additional predefined cell comprising, for example, at least one decoupling capacitor required to achieve a predetermined decoupling capacitance value, at least one gate array to allow additional logic to subsequently be added to the design and/or at least one white space fill cell to ensure process uniformity. Then, during the process of determining the on-chip locations for the functional device cells, the on-chip locations for the additional cell(s) can similarly be determined, based at least in part on their known polysilicon perimeter densities so as to ensure that the first region has the first average polysilicon perimeter density and/or that the second region has the second average polysilicon perimeter density.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of these embodiments without departing from the spirit thereof, and the embodiments include all such changes and modifications.

BRIEF DESCRIPTION OF THE SEVERAL VIEWS OF THE DRAWINGS

The embodiments of the invention will be better understood from the following detailed description with reference to the drawings, in which.

DETAILED DESCRIPTION OF THE INVENTION

Figure 1:
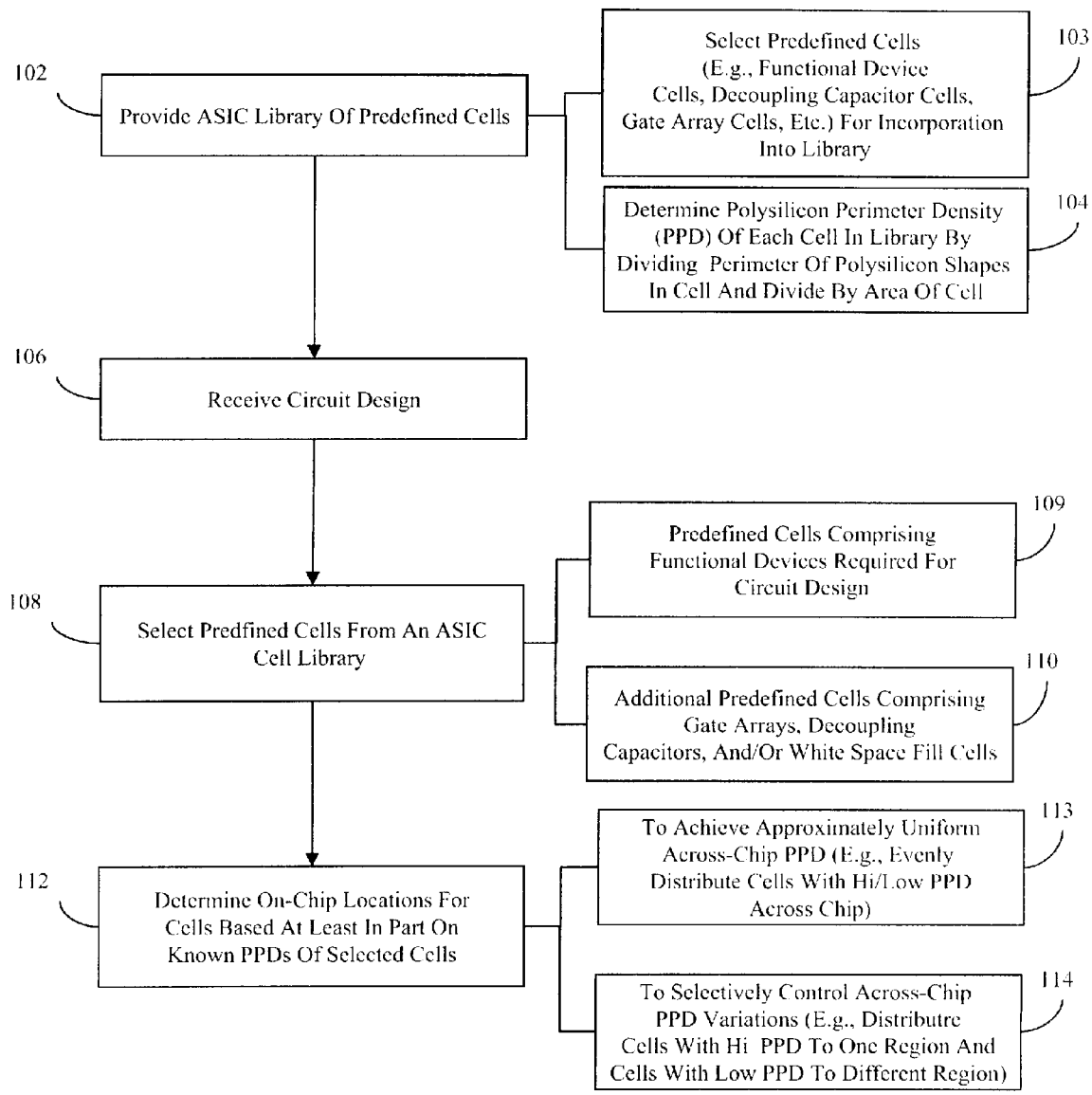
FIG. 1 is a flow diagram illustrating an embodiment of the method of the present invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, with continued scaling of integrated circuit devices, product developers have noticed variations in performance parameters of devices located within different regions on the same chip. In researching this phenomenon, the present inventors have linked such across-chip performance parameter variations to polysilicon perimeter density variations. Polysilicon perimeter density being defined as the sum of the perimeter of polysilicon shapes, such as polysilicon gate structures, in a defined location on an integrated circuit divided by the area of that defined location. Dielectric spacer thickness and, thereby affects device performance, are a function of polysilicon perimeter density. That is, chip regions with high polysilicon perimeter density have thinner dielectric spacers. Due to the thinner dielectric spacers, devices in such regions have, for example, relatively lower threshold voltages. Alternatively, chip regions with low polysilicon perimeter density have thicker dielectric spacers. Due to the thicker dielectric spacers, devices in such regions have, for example, relatively higher threshold voltages. Across-chip polysilicon perimeter density variations increase with each new technology node. As a result, any phenomenon attributable or correlated with such polysilicon perimeter density variations (e.g., across-chip variations in threshold voltage) will get successively worse with each new technology node. Unfortunately, current design verification tools do not take into account systematic within chip variation and are unable to respond to phenomenon related to polysilicon perimeter density variations.

In view of the foregoing, disclosed herein are embodiments of a method of laying out individual cells of an integrated circuit design, based at least in part on the known polysilicon perimeter densities of those cells. That is, the method embodiments use the knowledge of polysilicon perimeter density for known cells to drive placement of those cells on a chip (i.e., to drive floor-planning). The method embodiments can be used to achieve approximately uniform across-chip polysilicon perimeter density and, thereby to limit performance parameter variations between functional devices that are attributable to variations in polysilicon perimeter density. Alternatively, the method embodiments can be used to selectively control variations in the average polysilicon perimeter density of different regions of a chip and, thereby to selectively control certain performance parameter variations between functional devices located in those different regions.

Generally, referring to FIG. 1, the embodiments of the method comprise providing an Application-Specific Integrated Circuit (ASIC) library 200 of predefined cells with known polysilicon perimeter densities (102). Specifically, predefined cells 210a-x are selected for incorporation into such a library 200 (103, see FIG. 2). Each of these cells (e.g., see cells 210a-d) can comprise one or more functional devices 212a-d comprising, for example, memory arrays, ESD input networks, input/outputs, analog circuitry, custom logic, etc. Then, for each predefined cell 210a-d, the polysilicon perimeter density is determined by dividing a sum of the perimeter of all polysilicon shapes 213a-d (e.g., polysilicon gate conductors, polysilicon capacitor plate, polysilicon resistors, etc.) in the predefined cell by the area of the cell (104). Therefore, the unit of measurement for polysilicon perimeter density is l/a length unit (e.g., l/mm, l/microns, etc.). Since the cells 210*a-d* in the library 200 of FIG. 2 all have approximately the same area, the polysilicon perimeter density of the cell 210*a* will be relatively high because of the large number of smaller polysilicon shapes 213*a*. The polysilicon perimeter density of the cell 210*d* will be relatively low because of the small number of large polysilicon shapes 213*d*. Finally, the polysilicon perimeter densities of cells 210*b* and 210*c* will each be some intermediate density because of the varying number of different size and polysilicon shapes.

Figure 2:
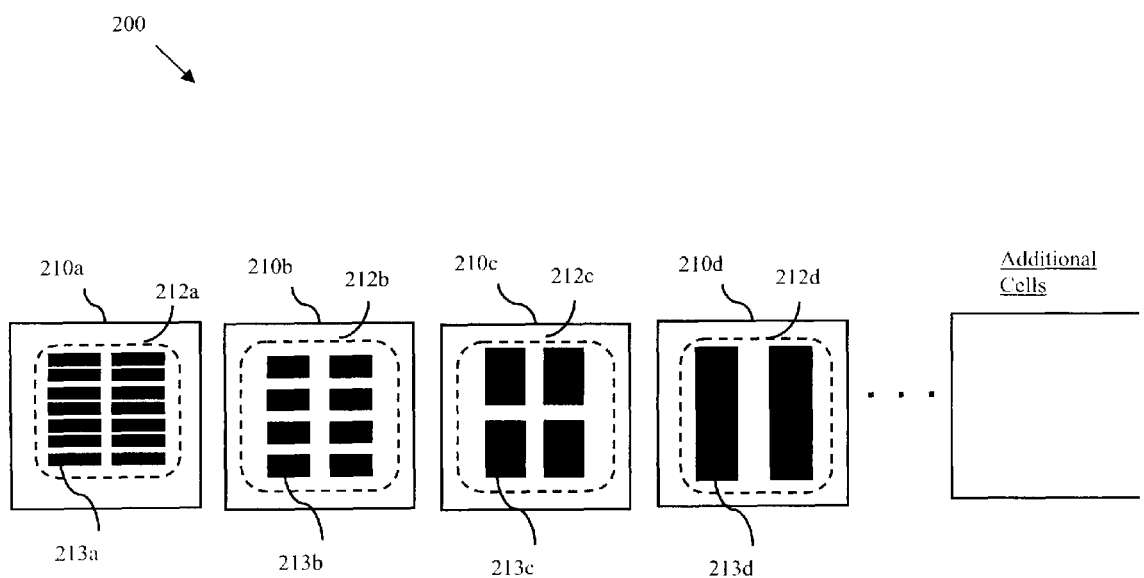
FIG. 2 is a block diagram illustrating an exemplary ASIC library for use in conjunction with the method embodiment of FIGS. 1 and 13.

It should be understood that FIG. 2 is offered for illustration purposes only. Thus, although FIG. 2 illustrates all of the cells 210*a-d* in the library 200 as being rectangular in shape and having the same area, these cells 210*a-d* will likely vary in shape and area, depending upon the required devices contained therein. An index of the predefined cells references, for each predefined cell 210*a-x* contained in the library 200, the known polysilicon perimeter density.

Then, a design for the integrated circuit is received (106). After the design is received, those cells (e.g., cells 210*a-d*) required to form the integrated circuit according to the design are selected from the ASIC library 200 and, more particularly, those cells containing the functional devices 212*a-d* required to form the integrated circuit according to the design are selected from the library 200 (108-109). Then, the locations on a chip for the cells are determined (i.e., laid out) based at least in part on the known polysilicon perimeter densities of the different cells to either achieve approximately uniform across-chip polysilicon perimeter density or to selectively control across-chip polysilicon perimeter density variations (112).

Figure 3:
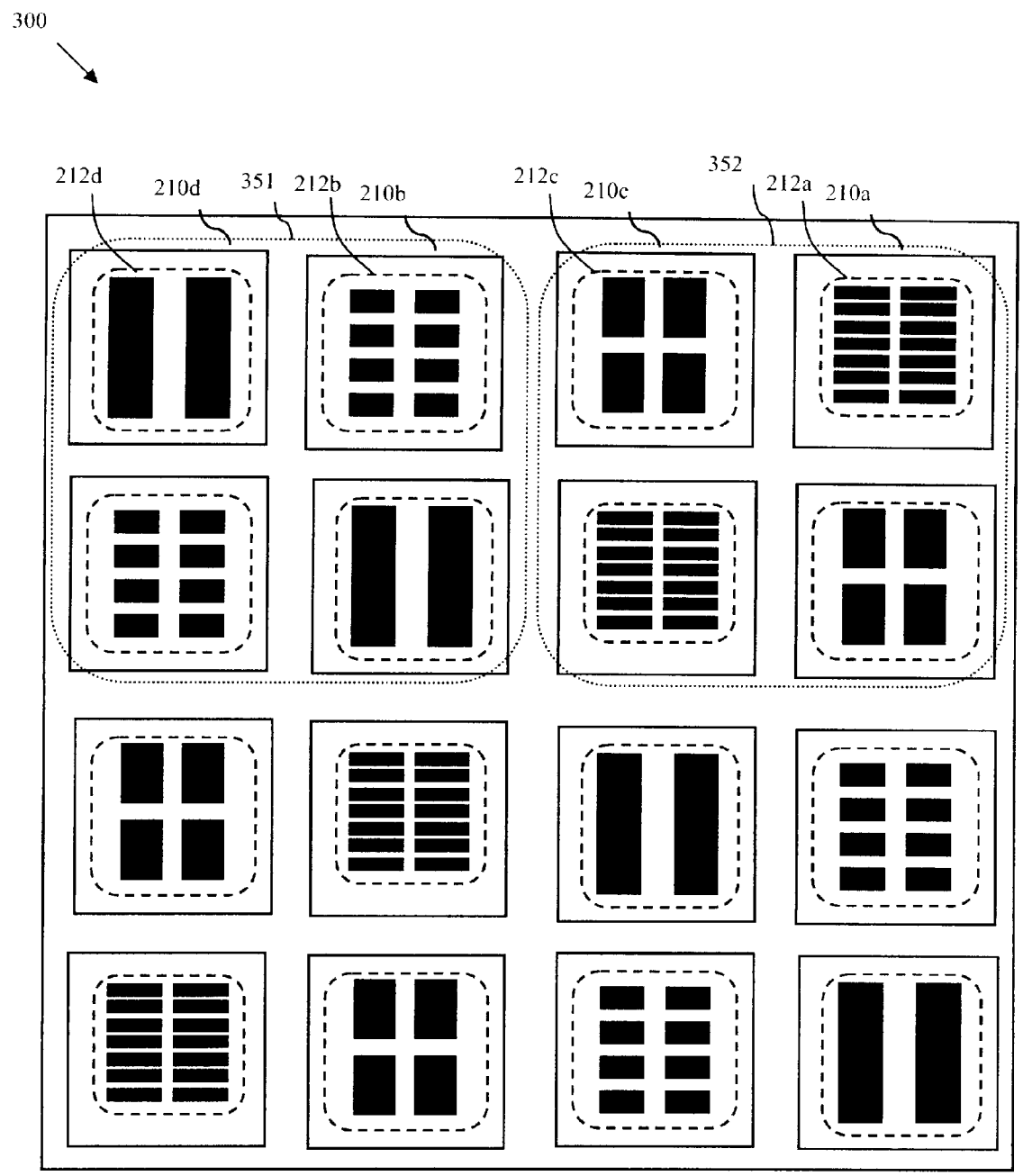
FIG. 3 is block diagram illustrating an exemplary completed chip layout formed according to the method embodiment of FIG. 1.

For example, the process (112) of determining the on-chip 300 locations for the cells 210*a-d* in order to achieve approximately uniform across-chip polysilicon perimeter density can comprise distributing cells 210*c-d* that have relatively high polysilicon perimeter densities approximately evenly across the chip 300 and similarly distributing cells that have relatively low polysilicon perimeter densities 210*a-b* approximately evenly across the chip 300 (113, see FIG. 3). In a more specific embodiment of the method, described below, a different technique is used to achieve approximately uniform across-chip polysilicon perimeter density. As a result of such approximately uniform polysilicon perimeter density, performance parameter variations between functional devices 212*a-d* in different regions 351 and 352 on the chip 300 and, more particularly, performance parameter variations that are attributable to polysilicon perimeter density variations (e.g., threshold voltage variations between functional devices in different regions of a chip) are limited.

Figure 4:
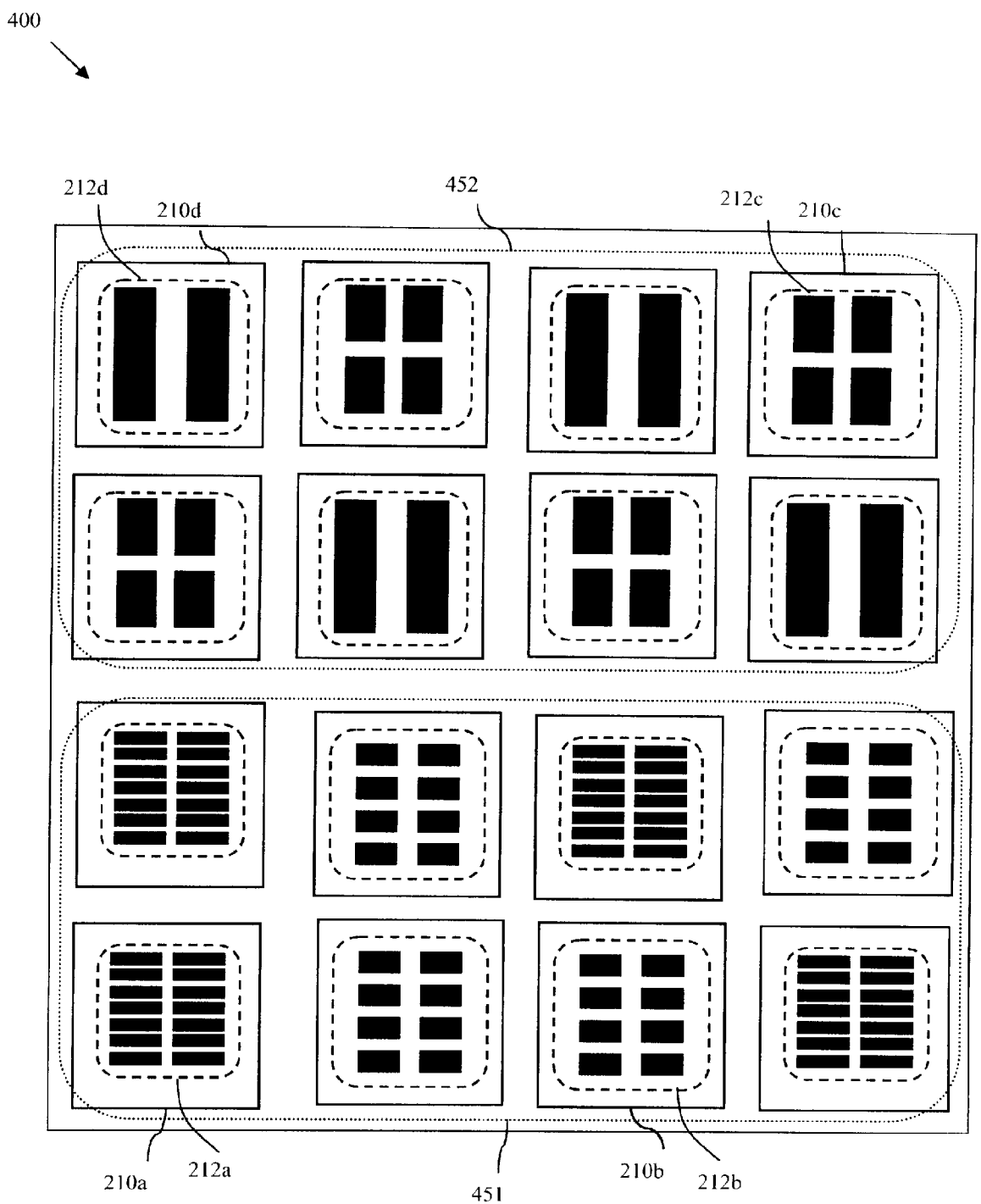
FIG. 4 is block diagram illustrating another exemplary completed chip layout formed according to the method embodiment of FIG. 1.

In another example, the process (112) of determining the on-chip locations for the cells 210*a-d* in order to selectively control across-chip polysilicon perimeter density variations comprises distributing cells having relatively high polysilicon perimeter densities (e.g., 210*a-b*) within a first region 451 of the chip 400; and distributing cells having a relatively low polysilicon perimeter density (e.g., 210*c-d*) within a second region 452 of the chip 400 that is different from the first region 451. By selectively controlling across-chip polysilicon perimeter density, designers can take advantage of known performance parameter variations (e.g., threshold voltage variations) that are attributable to polysilicon perimeter density variations between the first region 451 and the second region 452 (114, see FIG. 4). Thus, for example, cells 210*a* with functional devices 212*a* requiring faster switching speeds can be placed in one region 451 with a relatively high polysilicon perimeter density and cells 210*d* with functional devices requiring slower switching speeds can be placed in a different region 452 with a relatively low polysilicon perimeter density. In a more specific embodiment of the method, described below, a similar technique is used to selectively control across-chip polysilicon perimeter density.

It should be noted that in addition to containing predefined functional device cells required for integrated circuit designs, the provided library 200 can contain decoupling capacitor cells, gate array cells, white space fill cells (see items 102-103). Thus, process 108 can also comprise selecting, from the library 200, at least one additional cell comprising, for example, at least one decoupling capacitor required to achieve a predetermined decoupling capacitance value, at least one gate array to allow additional logic to subsequently be added to the design, and/or at least one white space fill cell to ensure process uniformity (110). Then, during process 112, the on-chip locations for the additional cell(s) can similarly be determined, based at least in part on their known polysilicon perimeter densities. It should also be noted that additional considerations for on-chip placement of the cells can include, but are not limited to, the spatial relationships between the cells to ensure efficient for fabrication.

Figure 5:
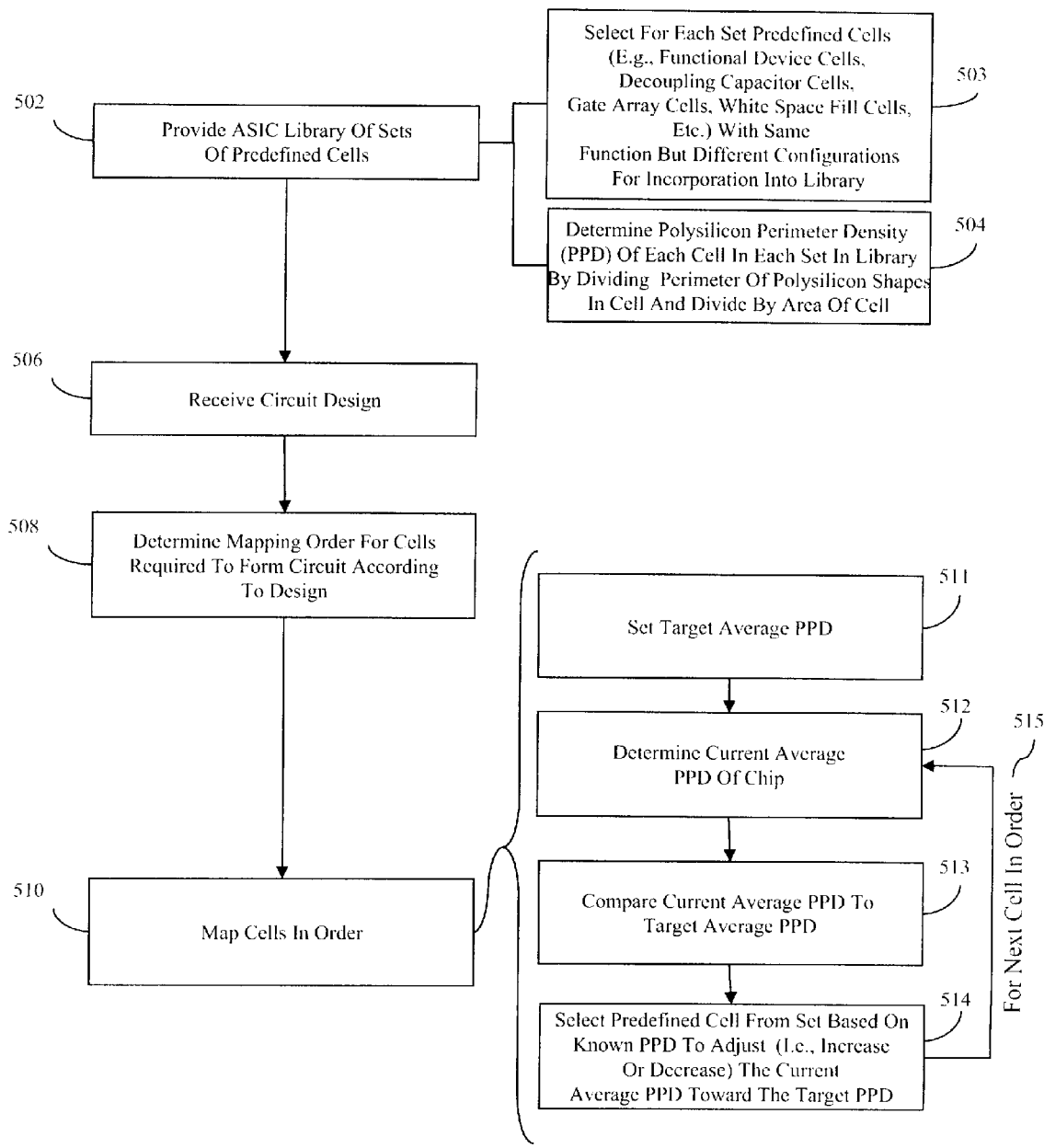
FIG. 5 is a flow diagram illustrating another embodiment of the method of the present invention.
Figure 6:
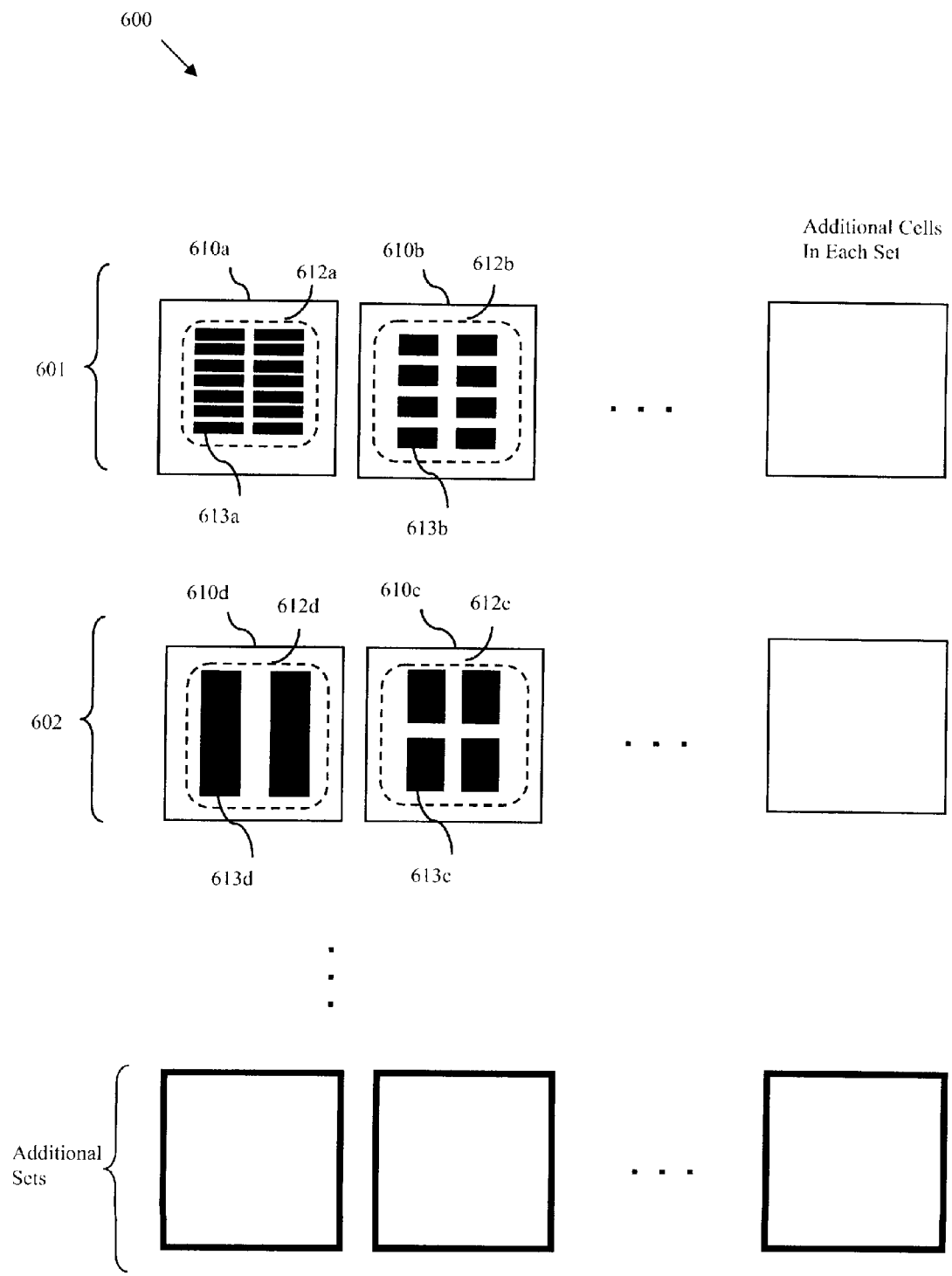
FIG. 6 is a block diagram illustrating an exemplary ASIC library for use in conjunction with the method embodiment of FIG. 5.

Referring to FIG. 5, in a more specific embodiment of the method used to achieve approximately uniform across-chip polysilicon perimeter density, an Application-Specific Integrated Circuit (ASIC) library 600 of predefined cells is similarly provided (502, see FIG. 6). Each of these cells (e.g., see cells 610*a-d*) can comprise one or more devices 612*a-d* comprising, for example, memory arrays, ESD input networks, input/outputs, analog circuitry, custom logic, etc. However, in this particular embodiment the provided ASIC library 600 contains sets of predefined cells (e.g., see exemplary sets 601 and 602), where each set 601 and 602 comprises multiple predefined cells (e.g., 610*a-b* of set 601 and 610*d-c* of set 602) and where each cell in each set has the same function, but different configurations (503). Thus, the cells in each set have different polysilicon perimeter densities. For example, the devices 612*a* and 612*b* in the different cells 610*a* and 610*b* in set 601 can have the same function but different configurations and, thereby different polysilicon perimeter densities. Similarly, the devices 612*c* and 612*d* of in the different cells 610*c* and 610*d* in set 602 can have the same function, but different configurations and, thereby different polysilicon perimeter densities.

Then, for each predefined cell 610*a-b*, 610*c-d* in each set 601, 602, the polysilicon perimeter density is determined and an index of the sets 601-602 of predefined cells will reference, for each predefined cell in each set contained in the library 600, the known polysilicon perimeter density. For each predefined cell, the polysilicon perimeter density is determined, in the same manner as described above, by dividing a sum of the perimeter of all polysilicon shapes 613*a-d* (e.g., polysilicon gate conductors, polysilicon capacitor plates, polysilicon resistors, etc.) in that predefined cell by the area of that cell (504). Since the cells 610*a-d* in the library 600 of FIG. 6 all have approximately the same area, the polysilicon perimeter density of the cell 610*a* will be relatively high because of the large number of smaller polysilicon shapes 613*a*. The polysilicon perimeter density of the cell 610*d* will be relatively low because of the small number of large polysilicon shapes 613*d*. Finally, the polysilicon perimeter densities of cells 611*b* and 610*c* will each be some intermediate density because of the varying number of different size and polysilicon shapes. It should be understood that FIG. 6 is offered for illustration purposes only. Thus, although FIG. 6 illustrates all of the cells 610a-d in the library 600 as being rectangular in shape and having the same area, these cells 610a-d will likely vary in shape and area, depending upon the required devices contained therein.

Once the ASIC library 600 is established, a design for an integrated circuit is received (506). After the design is received, a mapping order for those cells required to form the integrated circuit according to the design is determined and, more particularly, a mapping order for those cells containing the functional devices required to form the integrated circuit according to the design is determined (508). This mapping order is based on some predetermined criteria (e.g., based on how critical the cell is to the design).

Next, according to the mapping order, the cells are mapped out on the chip such that polysilicon perimeter density across the chip is approximately uniform and equal to a target average polysilicon perimeter density (510). Specifically, this mapping process comprises setting a target average polysilicon perimeter density (511). Then, for the first cell (as designated by the previously determined mapping order), a current average polysilicon perimeter density on the chip is determined (512). This current average polysilicon perimeter density of the chip is compared to a target average polysilicon perimeter density (513). Then, for that first cell, a predefined cell is selected from amongst the predefined cells in one of the sets of predefined cells in the library, based at least in part on the known polysilicon perimeter density of that predefined cell in order to adjust the current average polysilicon perimeter density towards the target average perimeter density (514). Thus, for example, if the current average polysilicon perimeter density is above the target average polysilicon perimeter density, then a predefined cell having a polysilicon perimeter density that is lower than the target average polysilicon perimeter density is selected for the first cell. Contrarily, if the current average polysilicon perimeter density is below the target average polysilicon perimeter density, then a predefined cell having a polysilicon perimeter density that is higher than the target average polysilicon perimeter density is selected for the first cell. This mapping process is repeated for the second cell in the mapping order, the third cell and so on, until all of the cells required for the design are mapped onto the chip (515).

For example, at process 508, a mapping order can be determined which requires: (1) selection of a cell from set 601, (2) selection of another cell from set 601, (3) selection of a cell from set 602, (4) selection of another cell from set 602 cell, (5) selection of yet another cell from set 602 and, finally (6) selection of a last cell from set 601 cell. At process 511, the target average polysilicon perimeter density can be set at some intermediate value between the polysilicon perimeter density of the cells 610b and 610c.

Figure 7:
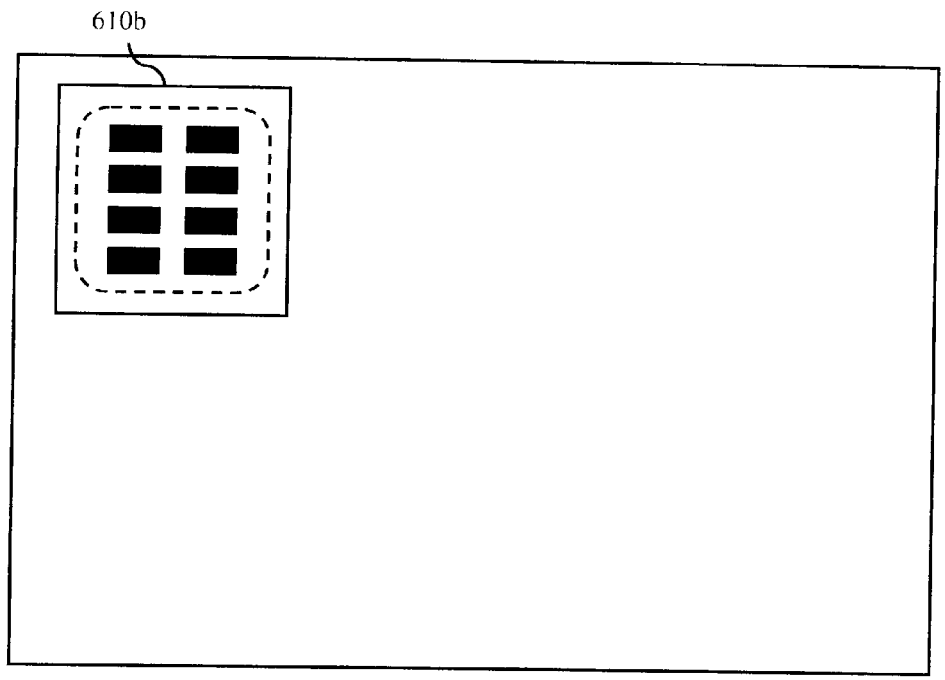
FIG. 7 is a block diagram illustrating an exemplary partially completed chip layout formed according to the method of FIG. 5.

When mapping the first cell in the order from set 601, the current average polysilicon perimeter density will be determined to be zero at process 512 if no polysilicon shapes are present on the chip. Consequently, at process 513, the current average polysilicon perimeter density will be significantly less than the target polysilicon perimeter density at process 513. Since all cells in set 601 have a greater polysilicon perimeter density than the target average and since the goal is to adjust the current average towards the target average, the predefined cell from set 601 that has a polysilicon perimeter density closest to the target average (i.e., cell 610b) is selected and laid out on the chip at process 514 (see FIG. 7).

Figure 8:
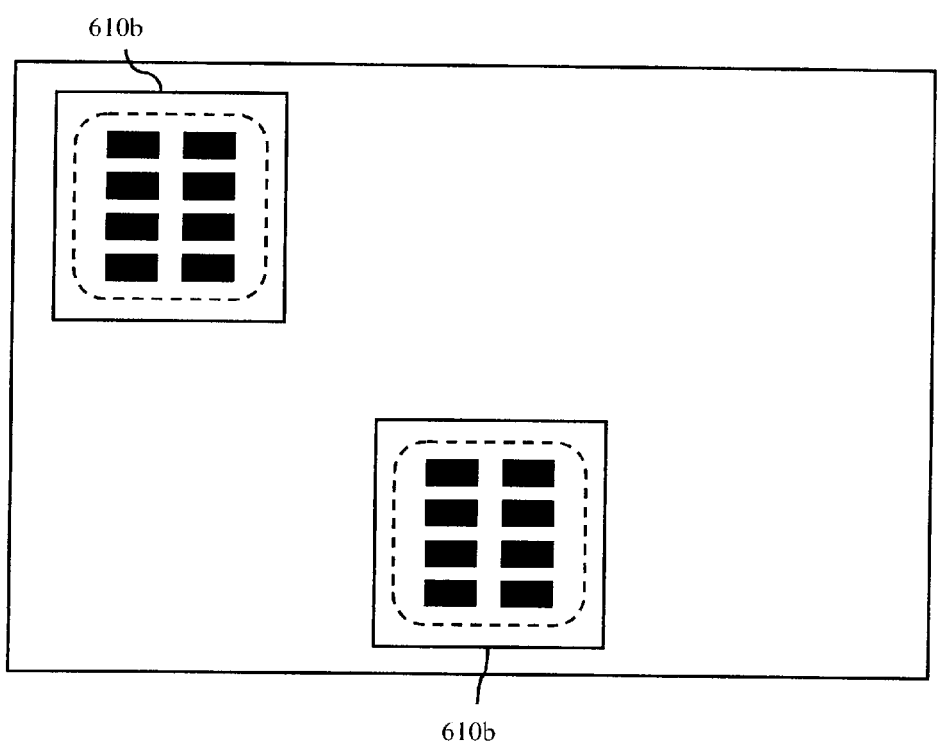
FIG. 8 is a block diagram illustrating an exemplary partially completed chip layout formed according to the method of FIG. 5.

For the second cell in the order from set 601, the process is repeated. The current average is determined at process 512 to be equal to that of cell 610b and is, therefore, determined at process 513 to be greater than the target average. Thus, the predefined cell from set 601 that has a polysilicon perimeter density closest to the target (i.e., cell 610b) is again selected and laid out on the chip at process 514 (see FIG. 8).

Figure 9:
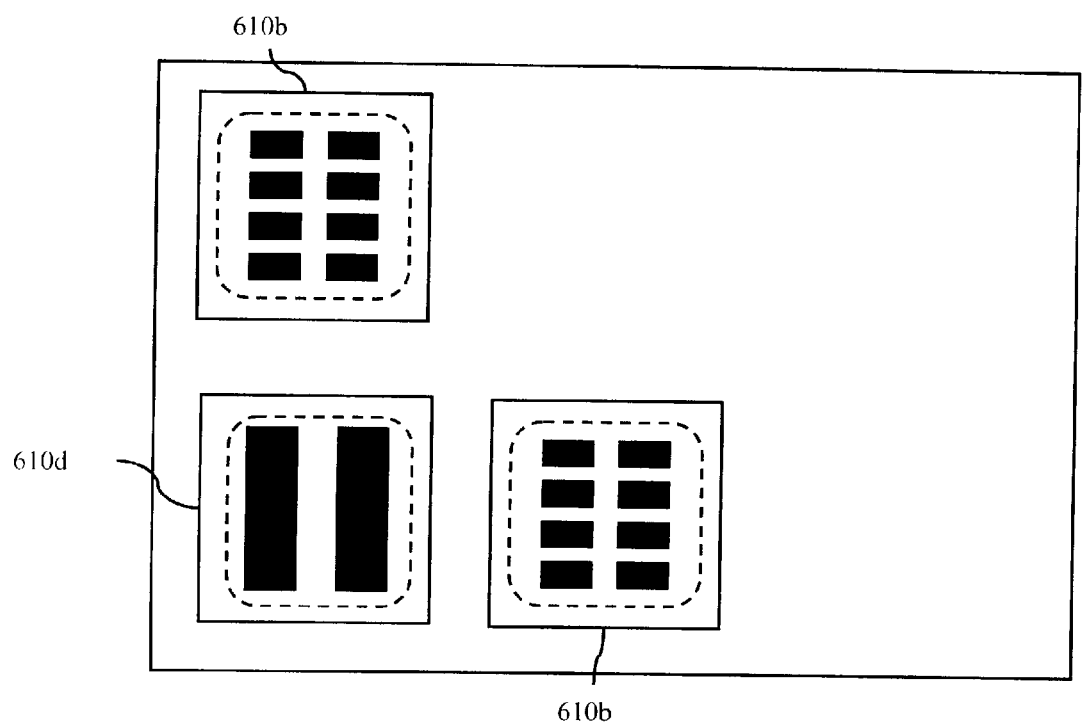
FIG. 9 is a block diagram illustrating an exemplary partially completed chip layout formed according to the method of FIG. 5.

For the third cell in the order from set 602, the process is repeated. The current average is determined at process 512 to be equal to that of cell 610b and is, therefore, determined at process 513 to be greater than the target average. Thus, the predefined cell from set 602 that has the lowest polysilicon perimeter density (i.e., cell 610d) will be selected to balance out the higher densities of the two 610b cells at process 514 (see FIG. 9).

Figure 10:
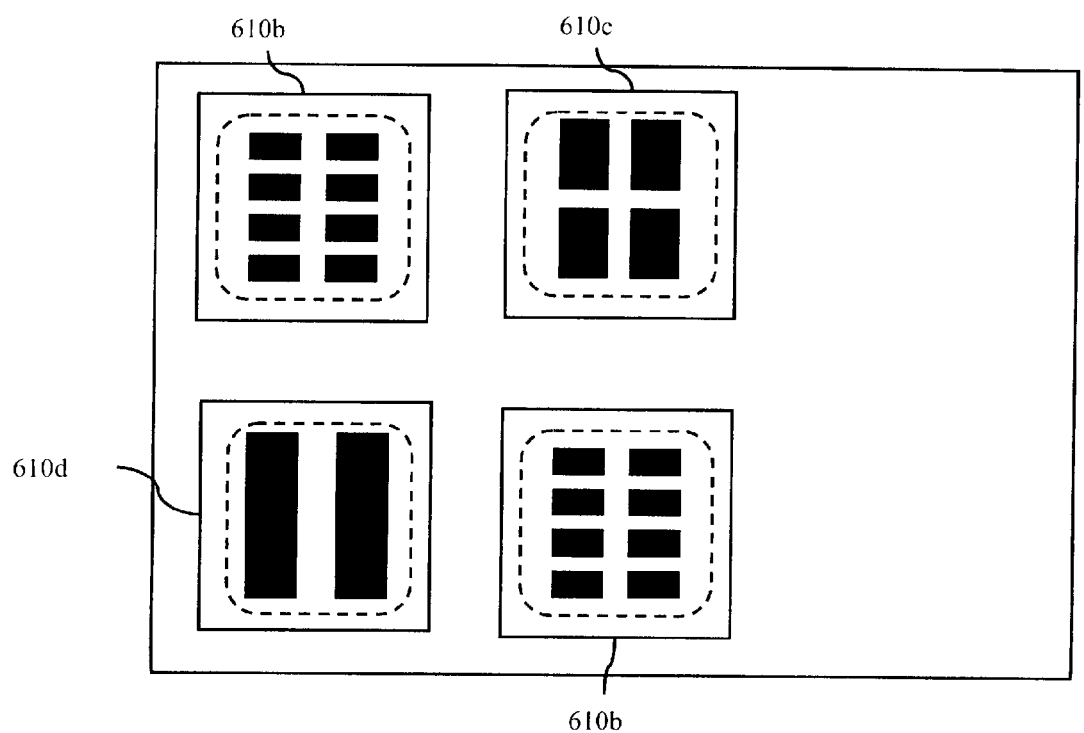
FIG. 10 is a block diagram illustrating an exemplary partially completed chip layout formed according to the method of FIG. 5.

For the fourth cell in the order from set 602, the process is repeated. The current average is determined at process 512 to be approximately equal to the target average. Thus, the predefined cell from set 602 that has a polysilicon perimeter density closest to the target average (i.e., cell 610c) is again selected and laid out on the chip at process 514 (see FIG. 10).

Figure 11:
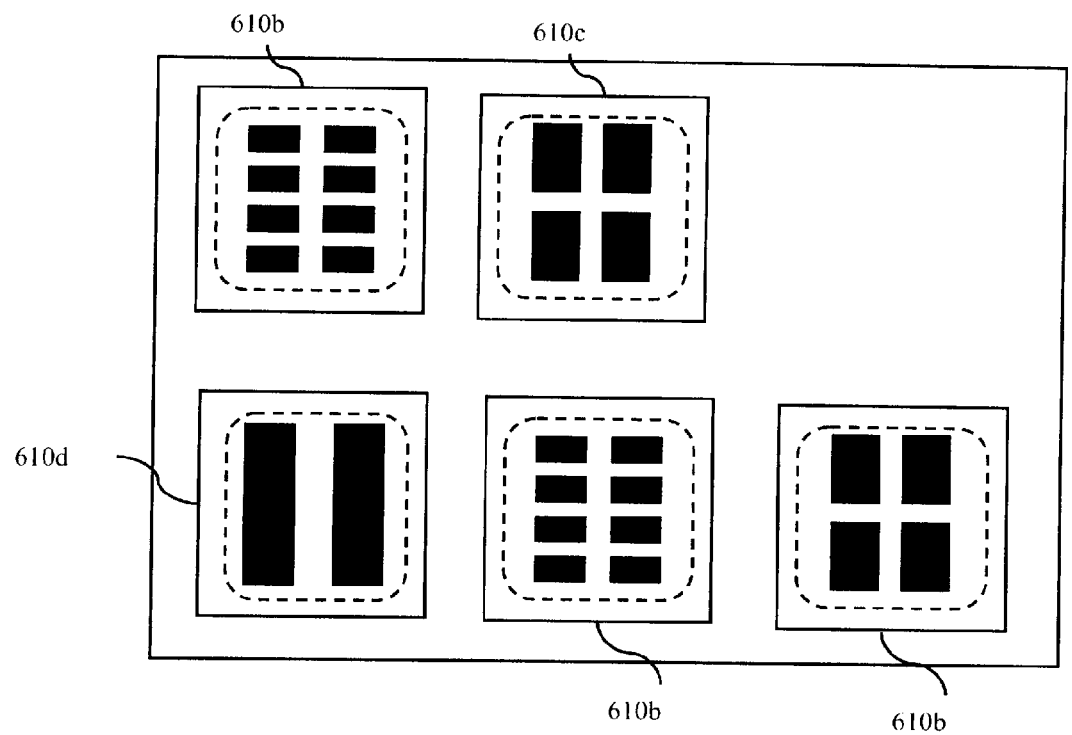
FIG. 11 is a block diagram illustrating an exemplary partially completed chip layout formed according to the method of FIG. 5.

For the fifth cell in the order from set 602, the process is repeated. The current average is determined at process 512 to be slightly less than the target average. Thus, the predefined cell from set 602 that has a polysilicon perimeter density closest to the target average (i.e., cell 610c) is again selected and laid out on the chip at process 514 (see FIG. 11).

For the sixth and final cell in the order from set 601, the process is repeated. The current average is determined at process 512 to be significantly less than the target average. Thus, the predefined cell from set 601 that has the highest polysilicon perimeter density (i.e., cell 610a) is selected to balance out the lower densities of the three cells from set 602 (see FIG. 12).

Figure 12:
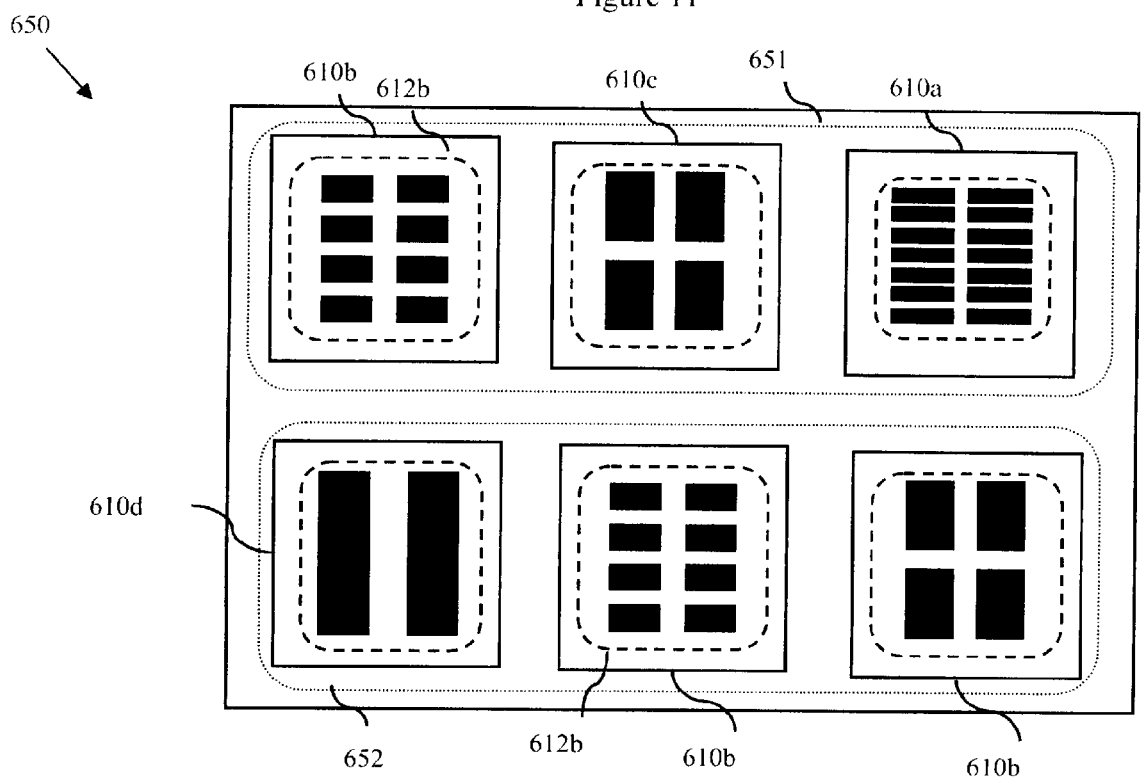
FIG. 12 is a block diagram illustrating an exemplary completed chip layout formed according to the method of FIG. 5.

Due to the approximately uniform polysilicon perimeter density, performance parameter variations between functional devices in different regions on the chip (e.g., see devices 612b in regions 651 and 652 of chip 650 of FIG. 12), more particularly, performance parameter variations that are attributable to polysilicon perimeter density variations (e.g., threshold voltage variations between functional devices in different regions of a chip) are limited.

It should be noted that in addition to containing sets of predefined functional device cells required for integrated circuit designs, the library 600 can also contain sets of predefined decoupling capacitor cells, gate arrays cells, white space fill cells, etc. (see items 502-503). Thus, at process 508, the mapping order for decoupling capacitor cells required to achieve a predetermined decoupling capacitance value, for gate array cells that will allow additional logic to subsequently be added to the design, and/or for white space fill cells to ensure process uniformity. This mapping order can be determined either separately from or in conjunction with the mapping order for the functional device cells. Once the mapping order is determined, then at process 510 the decoupling capacitor cells, the gate array cells and/or the white space fill cells can be mapped in the same manner, as described above, used for the functional device cells (see items 511-515). It should also be noted that additional considerations for on-chip placement of the cells can include, but are not limited to, the spatial relationships between the cells to ensure efficient for fabrication.

Figure 13:
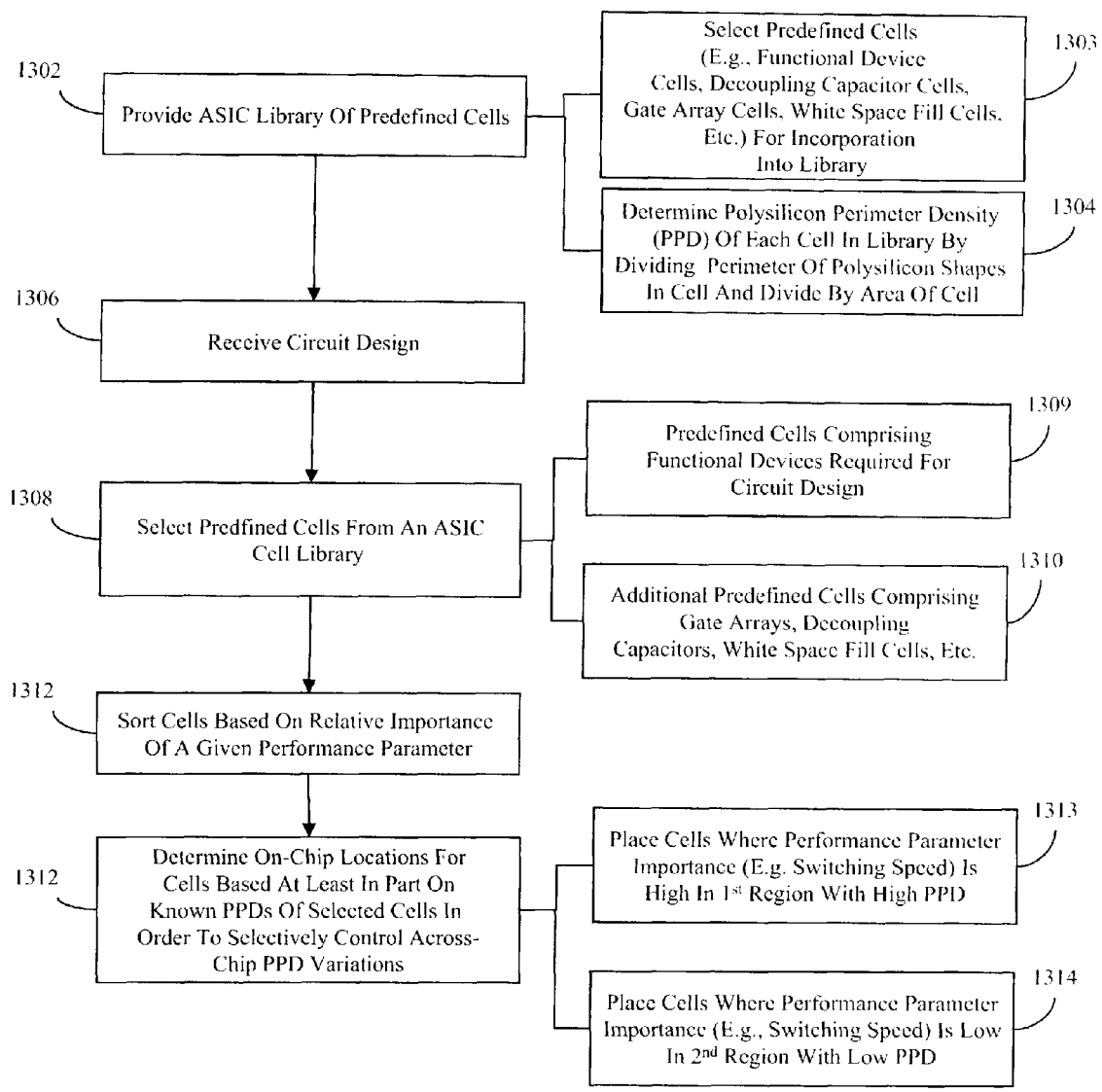
FIG. 13 is a flow diagram illustrating yet another embodiment of the method of the present invention.

Referring to FIG. 13, in another more specific embodiment of the method used for selectively controlling across-chip polysilicon perimeter density, a library 200 of predefined cells with known polysilicon perimeter densities in the same manner as described above and illustrated in FIG. 2 (1302). That is, predefined cells 210a-x are selected for incorporation into such a library 200 (1303, see FIG. 2). Each of these cells (e.g., see cells 210a-d) can comprise one or more functional devices 212a-d comprising, for example, memory arrays, ESD input networks, input/outputs, analog circuitry, custom logic, etc. Then, for each predefined cell 210*a-d*, the polysilicon perimeter density is determined by dividing a sum of the perimeter of all polysilicon shapes 213*a-d* (e.g., polysilicon gate conductors, polysilicon capacitor plate, polysilicon resistors, etc.) in the predefined cell by the area of the cell (104). Therefore, the unit of measurement for polysilicon perimeter density is 1/a length unit (e.g., 1/mm, 1/microns, etc.). Since the cells 210*a-d* in the library 200 of FIG. 2 all have approximately the same area, the polysilicon perimeter density of the cell 210*a* will be relatively high because of the large number of smaller polysilicon shapes 213*a*. The polysilicon perimeter density of the cell 210*d* will be relatively low because of the small number of large polysilicon shapes 213*d*. Finally, the polysilicon perimeter densities of cells 210*b* and 210*c* will each be some intermediate density because of the varying number of different size and polysilicon shapes.

Then, a design for the integrated circuit is received (1306). After the design is received, those cells (e.g., cells 210*a-d*) required to form the integrated circuit according to the design are selected from the ASIC library 200 and, more particularly, those cells containing the functional devices 212*a-d* required to form the integrated circuit according to the design are selected from the library 200 (1308). These multiple predefined cells are then sorted based on relative importance of a specified performance parameter and, specifically, on the relative importance of a specific performance parameter that is impacted by variations in polysilicon perimeter density across a chip (1312). For example, variations in threshold voltage between devices in different regions of a chip are attributable to variations in the local polysilicon perimeter densities between those regions.

Once the cells are sorted based on the relative importance of the specified performance parameter, the locations on the chip for the multiple predefined cells is determined based at least on part on the relative importance of the specified performance parameter (1314). That is, as illustrated on the chip 400 of FIG. 4, predefined cells 210*a-b* for which the specific performance parameter is of high importance are located in a first region 451 of the chip 400 having a first average polysilicon perimeter density, whereas predefined cells 210*c-d* for which the specific performance parameter is of low importance are located in a second region 452 of the chip 400 having an second average polysilicon perimeter density that is different from the first average polysilicon perimeter density. This process takes advantage of the variations in polysilicon perimeter density and, more particularly, selectively controls across-chip polysilicon perimeter density so that functional devices 212*a-b* in the first region 451 will perform differently than functional devices 212*c-d* in the second region 452.

For example, the specified performance parameter can be switching speed because switching speed depends on threshold voltage. As mentioned above, threshold voltage varies between different devices depending upon the local polysilicon perimeter density. In regions (e.g., region 451) with higher polysilicon perimeter density, spacer widths are thinner. Thus, threshold voltages are lower and switching speeds are faster. In regions (e.g., 452) with lower polysilicon perimeter density, spacer widths are thicker. Thus, threshold voltages are higher and switching speeds are slower. In this case, the importance of switching speed to the functional devices in each cell can be determined at process 1312, then the process of determining the locations on the chip for each of the predefined cells at process 1314 can comprise placing the predefined cells 212*a-b* requiring relatively fast switching speeds in the first region 451, where the first average polysilicon perimeter density is a relatively high polysilicon perimeter density (1313). This process can further comprise placing the predefined cells 212*c-d* requiring relatively slow switching in the second region 452, where the second average polysilicon perimeter density is a relatively low polysilicon perimeter density (1314). Thus, the process selectively controls the polysilicon perimeter density in the first and second regions of the chip so that the functional devices in these regions have different optimal switching speeds.

It should be noted that in addition to containing predefined functional device cells required for integrated circuit designs, the provided library 600 can contain decoupling capacitor cells, gate array cells, white space fill cells, etc. (see items 1302-1302). Thus, process 1308 can also comprise selecting, from the library 600, at least one additional predefined cell comprising, for example, at least one decoupling capacitor required to achieve a predetermined decoupling capacitance value, at least one gate array to allow additional logic to subsequently be added to the design, and/or at least one white space fill cell to ensure process uniformity (1310). Then, during process 1312, the on-chip locations for the additional cell(s) can similarly be determined, based at least in part on their known polysilicon perimeter densities so as to ensure that the first region 451 has the first average polysilicon perimeter density and/or that the second region 452 has the second average polysilicon perimeter density. It should also be noted that additional considerations for on-chip placement of the cells can include, but are not limited to, the spatial relationships between the cells to ensure efficient for fabrication.

Figure 14A:
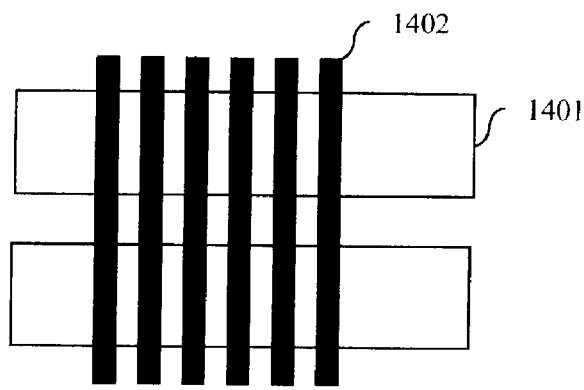
FIGS. 14a-c are block diagrams illustrating an exemplary gate array, an exemplary decoupling capacitor and an exemplary white space fill cell, respectively.
Figure 14B:
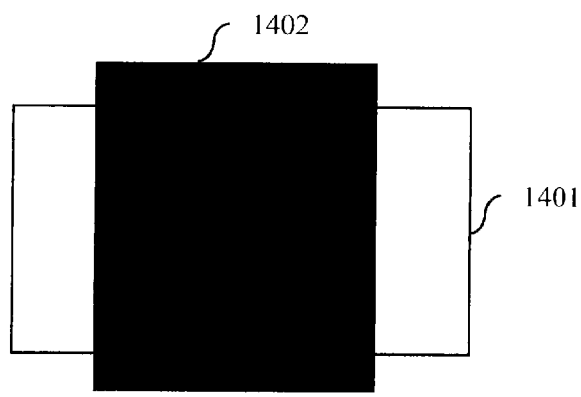
Figure 14C:
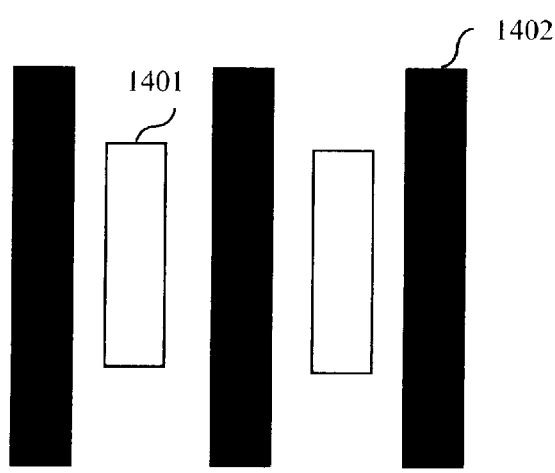

Additionally, it should be understood that for the purposes of the above-described method embodiments a gate array (e.g., as illustrated in FIG. 14*a*) is a type of design cell with one or more unused devices, such as field effect transistors, comprising both active silicon 1401 (e.g., source/drain and channel regions) and polysilicon 1402 (e.g., polysilicon gate conductors). These unused devices are not part of the current integrated circuit design. The intention of their use is to enable a redesign at minimal cost. Specifically, integrated circuit redesign is possible by changing the back end of the line (BEOL) wiring in order to implement the unused devices in the gate array, while keeping the front end of line (FEOL) (i.e., the polysilicon, active, and implant levels) the same. Often, the physical design of such gate arrays includes multiple elongated polysilicon gate structures traversing one or more active silicon bodies. Thus, gate array cells typically have a relatively high polysilicon perimeter density. It should also be understood that for the purposes of the above-described method and structure embodiments a decoupling capacitor (e.g., as illustrated in FIG. 14*b*) is a capacitor device comprising both active silicon 1401 (e.g., a first capacitor plate) and polysilicon 1402 (e.g., a second capacitor plate) separated by a dielectric layer (not shown). These decoupling capacitor devices are used to add noise margin to an integrated circuit by adding capacitance to remove high frequency switching noise from impacting sensitive circuitry. Typically, decoupling capacitor cells are added in parallel with the power distribution. They are placed throughout the integrated circuit design and, particularly, are placed close to noise sensitive circuits where room allows. Often, the physical design for decoupling capacitors is large. That is, both the active silicon 1401 area and polysilicon 1402 area is large. Thus, decoupling capacitors typically have a relatively low polysilicon perimeter density. Lastly, it should be understood that white space fill cells (e.g., as illustrated in FIG. 14*c*) are cells which have no actual function. They are used in some design methodologies to fill up locations where integrated circuit device cells are not placed (e.g., to allow for process uniformity for short range phenomenon, such as lithography, chemical mechanical planarization (CMP), anneals, etc.). These white space fill cells do not contain any devices, but typically have some amount of active silicon 1401 and polysilicon 1402 present. Furthermore, the polysilicon perimeter density is typically low, but can be manipulated.

Therefore, disclosed above are embodiments of a method of laying out individual cells of an integrated circuit design, based at least in part on the known polysilicon perimeter densities of those cells. That is, the method embodiments use the knowledge of polysilicon perimeter density for known cells to drive placement of those cells on a chip (i.e., to drive floor-planning). The method embodiments can be used to achieve approximately uniform across-chip polysilicon perimeter density and, thereby to limit performance parameter variations between functional devices that are attributable to variations in polysilicon perimeter density. Alternatively, the method embodiments can be used to selectively control variations in the average polysilicon perimeter density of different regions of a chip and, thereby to selectively control certain performance parameter variations between functional devices located in those different regions.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that these embodiments can be practiced with modification within the spirit and scope of the appended claims.

What is claimed is:

1. A method of forming an integrated circuit, said method comprising:
    providing a library of predefined cells with known polysilicon perimeter densities, said providing of said library comprising determining a polysilicon perimeter density for each predefined cell by dividing a sum of the perimeter of all polysilicon shapes in said predefined cell by the area of said cell;
    receiving a design for said integrated circuit;
    selecting, from said library, cells required to form said integrated circuit according to said design; and
    determining locations on a chip for said cells and placing said cells in said locations to form said integrated circuit, said determining of said locations and said placing of said cells in said locations being performed based at least in part on said known polysilicon perimeter densities in order to achieve one of approximately uniform across-chip polysilicon perimeter density and selectively controlled across-chip polysilicon perimeter density variations;
    said determining of said locations on said chip and said placing of said cells in said locations to achieve said approximately uniform across-chip polysilicon perimeter density comprising distributing cells having relatively high polysilicon perimeter densities approximately evenly across said chip.

2. The method according to claim 1, wherein performance parameter variations between functional devices on said chip and attributable to polysilicon perimeter density variations are limited as a result of said approximately uniform polysilicon perimeter density.

3. The method according to claim 1, wherein threshold voltage variations between functional devices on said chip are limited as a result of said approximately uniform polysilicon perimeter density uniformity across.

4. The method according to claim 1, said determining of said locations on said chip and said placing of said cells in said locations to achieve selectively controlled across-chip polysilicon perimeter density variations comprising:
    distributing cells having relatively high polysilicon perimeter densities within a first region of said chip; and
    distributing cells having a relatively low polysilicon perimeter density within a second region of said chip that is different from said first region so as to take advantage of known performance parameter variations attributable to polysilicon perimeter density variations between said first region and said second region.

5. The method according to claim 1, further comprising:
    selecting, from said library, at least additional cell comprising at least one decoupling capacitor required to achieve a predetermined decoupling capacitance value; and
    during said determining of said locations on said chip for said cells, also determining a location on said chip for said at least one additional cell based at least in part on a known polysilicon perimeter density of said at least one additional cell.

6. The method according to claim 1, further comprising:
    selecting, from said library, at least one additional cell comprising at least one gate array to allow additional logic to subsequently be added to said design; and
    during said determining of said locations on said chip for said cells and placing said cells in said locations, also determining a location on said chip for said at least one additional cell and placing said at least one additional cell in said location based at least in part on a known polysilicon perimeter density of said at least one additional cell.

7. A method of forming an integrated circuit, said method comprising:
    providing a library with sets of predefined cells, each set comprising predefined cells having a same function but different polysilicon perimeter densities, said providing of said library comprising determining a polysilicon perimeter density for each predefined cell in each set by dividing a sum of the perimeter of all polysilicon shapes in said predefined cell by the area of said cell;
    receiving a design for said integrated circuit;
    determining, based on a predetermined criteria, a mapping order for cells required to form said integrated circuit according to said design;
    according to said mapping order, for each cell required to form said integrated circuit according to said design, mapping said cells on a chip such that, when said cells are subsequently placed on said chip to form said integrated circuit, polysilicon perimeter density across said chip is approximately uniform, said mapping comprising, for each cell:
        determining a current average polysilicon perimeter density on said chip;
        comparing said current average polysilicon perimeter density of said chip to a target average polysilicon perimeter density; and
        selecting for said cell a predefined cell from one of said sets in said library, wherein said selecting is based at least in part on a known polysilicon perimeter density of said predefined cell in order to adjust said current average polysilicon perimeter density towards said target average perimeter density; and based on said mapping, placing selected predefined cells on said chip to form said integrated circuit.

8. The method according to claim 7, said selecting further comprising, if said current average polysilicon perimeter density is above said target average polysilicon perimeter density, selecting for said cell a predefined cell having a polysilicon perimeter density that is lower than said target average polysilicon perimeter density.

9. The method according to claim 7, said selecting further comprising if said current average polysilicon perimeter density is below said target average polysilicon perimeter density, selecting for said cell a predefined cell having a polysilicon perimeter density that is higher than said target average polysilicon perimeter density.

10. The method according to claim 7, further comprising mapping at least one decoupling capacitor cell in a same manner as said mapping of said cells.

11. The method according to claim 7, further comprising mapping at least one gate array cell in a same manner as said mapping of said cells.

12. The method according to claim 7, wherein performance parameter variations between functional devices on said chip and attributable to polysilicon perimeter density variations are limited as a result of said approximately uniform polysilicon perimeter density across said chip.

13. A method of forming an integrated circuit, said method comprising:

providing a library of predefined cells with known polysilicon perimeter densities, said providing of said library comprising determining a polysilicon perimeter density for each predefined cell by dividing a sum of the perimeter of all polysilicon shapes in said predefined cell by the area of said cell;

receiving a design for said integrated circuit;

selecting, from said library, multiple predefined cells required to form said integrated circuit according to said design;

sorting said multiple predefined cells based on relative importance of a specified performance parameter, wherein variations in said specified performance parameter are attributable to variations in polysilicon perimeter density across a chip; and determining locations on said chip for said multiple predefined cells and placing said multiple predefined cells on said chip to form said integrated circuit, said determining of said locations and said placing of said multiple predefined cells being performed based at least in part on said relative importance of said specified performance parameter such that predefined cells for which said specific performance parameter is of high importance are located in a first region of said chip having a first average polysilicon perimeter density and such that predefined cells for which said specific performance parameter is of low importance are located in a second region of said chip having an second average polysilicon perimeter density that is different from said first average polysilicon perimeter density.

14. The method according to claim 13, said specified performance parameter comprising switching speed, and said determining of said locations and said placing of said multiple predefined cells on said chip comprising:

placing predefined cells requiring relatively fast switching speeds in said first region, wherein said first average polysilicon perimeter density of said first region is a relatively high polysilicon perimeter density; and placing predefined cells requiring relatively slow switching in said second region, wherein said second average polysilicon perimeter density of said second region is a relatively low polysilicon perimeter density.

15. The method according to claim 13, said determining of said locations and said placing of said multiple predefined cells on said chip takes advantage of said variations in polysilicon perimeter density so that functional devices in said first region perform differently than functional devices in said second region.

16. The method according to claim 13, further comprising:

selecting from said library at least one additional predefined cells, wherein said additional predefined cells comprise at least one of a decoupling capacitor required to achieve a predetermined decoupling capacitance value and a gate array to allow additional logic to subsequently be added to said design; and determining a location on said chip for said at least one additional predefined cell and placing said at last one additional predefined cell in said location so as to ensure that at least one of said first region has said first average polysilicon perimeter density and said second region has said second average polysilicon perimeter density.

* * * * *